United States Patent
Kirkhope et al.

(10) Patent No.: US 9,631,674 B2
(45) Date of Patent: Apr. 25, 2017

(54) DETERMINING THE OPTIMAL RADIUS OF A THRUST BEARING IN A WELL TOOL

(71) Applicant: Halliburton Energy Services, Inc., Houston, TX (US)

(72) Inventors: Kennedy J. Kirkhope, Leduc (CA); Alben D'Silva, Edmonton (CA)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 0 days.

(21) Appl. No.: 15/022,122

(22) PCT Filed: Apr. 1, 2015

(86) PCT No.: PCT/US2015/023885
§ 371 (c)(1),
(2) Date: Mar. 15, 2016

(87) PCT Pub. No.: WO2016/160013
PCT Pub. Date: Oct. 6, 2016

(65) Prior Publication Data
US 2017/0023066 A1    Jan. 26, 2017

(51) Int. Cl.
*F16C 43/04* (2006.01)
*G06F 17/50* (2006.01)

(52) U.S. Cl.
CPC .......... *F16C 43/04* (2013.01); *G06F 17/5018* (2013.01)

(58) Field of Classification Search
CPC ...... F16C 1/28; F16C 11/0685; F16C 11/069; F16C 43/02; G06F 17/5009;
(Continued)

(56) References Cited

U.S. PATENT DOCUMENTS 2,100,418 A * 11/1937 Welikanov ............ E21B 47/024
166/113
6,109,368 A * 8/2000 Goldman ................ E21B 12/02
175/39
(Continued)

FOREIGN PATENT DOCUMENTS

WO    2009075667 A2    6/2009

OTHER PUBLICATIONS

International Search Report and Written Opinion issued by the Korean Intellectual Property Office regarding International Application No. PCT/US2015/023885, dated Jan. 29, 2016, 10 pages.

*Primary Examiner* — Jason L Vaughan
(74) *Attorney, Agent, or Firm* — Haynes and Boone, LLP

(57) ABSTRACT

A method and apparatus according to which the optimal radius of a thrust bearing in a well tool is determined. In one embodiment, the method includes receiving inputs representing a plurality of geometric characteristics and material properties of the well tool, the well tool including a housing, a shaft extending within the housing, and the thrust bearing, which includes convex and concave surfaces that define an interface having a radius; determining, based on the inputs, an expected value of the bending moment of the well tool in the vicinity of the thrust bearing; determining, based on the expected value of the bending moment, one or more expected values of the radial reaction force at the interface, which values depend upon the radius of the interface; and selecting, based on the one or more expected values of the radial reaction force, an optimal radius of the interface.

20 Claims, 7 Drawing Sheets

(58) Field of Classification Search
CPC .. G06F 17/5018; G06F 17/5022; E21B 4/003; E21B 10/22; Y10T 29/49643; Y10T 29/497; Y10T 29/49648; Y10T 29/49657; Y10T 29/49664
See application file for complete search history.

(56) References Cited

U.S. PATENT DOCUMENTS

| | | | |
|---|---|---|---|
| 6,260,635 B1* | 7/2001 | Crawford | E21B 10/22 175/371 |
| 7,360,612 B2* | 4/2008 | Chen | E21B 10/22 175/372 |
| 7,503,403 B2* | 3/2009 | Jogi | E21B 7/06 175/45 |
| 7,870,912 B2* | 1/2011 | Dolgin | E21B 47/022 175/45 |
| 2004/0254664 A1* | 12/2004 | Centala | E21B 10/00 700/97 |
| 2005/0150689 A1 | 7/2005 | Jogi et al. | |
| 2008/0035376 A1* | 2/2008 | Freyer | E21B 7/062 175/45 |
| 2008/0053705 A1 | 3/2008 | Aronstam et al. | |
| 2008/0154552 A1* | 6/2008 | Lin | E21B 10/22 703/1 |
| 2009/0090556 A1 | 4/2009 | Chen | |
| 2013/0282342 A1 | 10/2013 | Bailey et al. | |

* cited by examiner

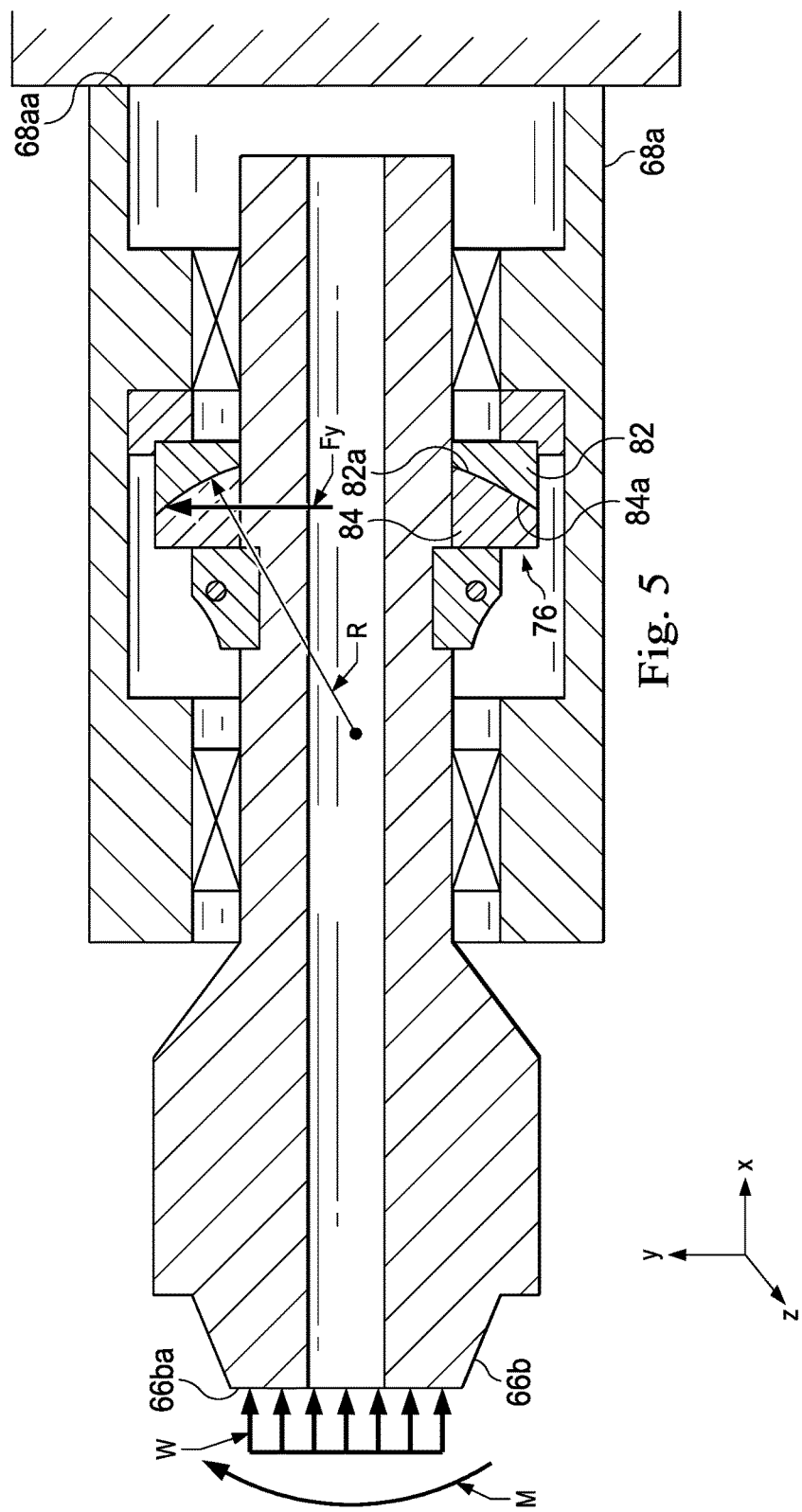

US 9,631,674 B2

DETERMINING THE OPTIMAL RADIUS OF A THRUST BEARING IN A WELL TOOL

TECHNICAL FIELD

The present disclosure relates generally to well drilling operations and, more specifically, to enhancing the performance of a well tool by determining the optimal radius of a thrust bearing in the well tool.

BACKGROUND

In the process of drilling an oil or gas wellbore, a well tool is run downhole on a tubular drill string. The well tool may include a rotary drill bit, which may be supported by a rotary steerable drilling tool. The well tool may also include other components such as, for example, a power section, an electronics section, drill collars, heavy-weight drill pipe, stabilizers, reamers, jarring devices, hole-openers, crossovers for various threadforms, or any combination thereof. Load bearing components, such as thrust bearing(s) and/or radial bearing(s), are adapted to carry axial and radial loads imparted to the well tool during drilling operations. In order to drill the wellbore, the drill string is rotated while applying weight-on-bit to the rotary drill bit. At the same time, a drilling fluid is communicated through the drill string and ejected into the wellbore through jets in the rotary drill bit, thereby clearing away drill cuttings from the rotary drill bit. The rotary steerable drilling tool controls the angle and azimuth of the rotary drill bit, causing the rotary drill bit to drill the wellbore along a curved or deviated path. The well tool is subject to external forces from the wellbore as it traverses the curved or deviated portion of the wellbore. Other factors may also subject the well tool to external forces such as, for example, the rotation or weight-on-bit applied to the well tool through the drill string and/or the pressure and temperature of the wellbore. These external forces cause a bending moment and/or deflection of the well tool. Depending on the geometry of the thrust bearing(s), the bending moment and/or deflection of the well tool may cause an unacceptable radial reaction force within the thrust bearing(s), thereby possibly jeopardizing the efficiency and/or reliability of the bearing(s). Furthermore, failure of the thrust bearing(s) may cause damage to the wellbore and/or other components of the well tool.

BRIEF DESCRIPTION OF THE DRAWINGS

Various embodiments of the present disclosure will be understood more fully from the detailed description given below and from the accompanying drawings of various embodiments of the disclosure. In the drawings, like reference numbers may indicate identical or functionally similar elements.

FIG. 5 is a free body diagram of the load-bearing assembly of FIG. 2, shown to illustrate another step of the method of FIG. 3, according to an exemplary embodiment.

DETAILED DESCRIPTION

Figure 1:
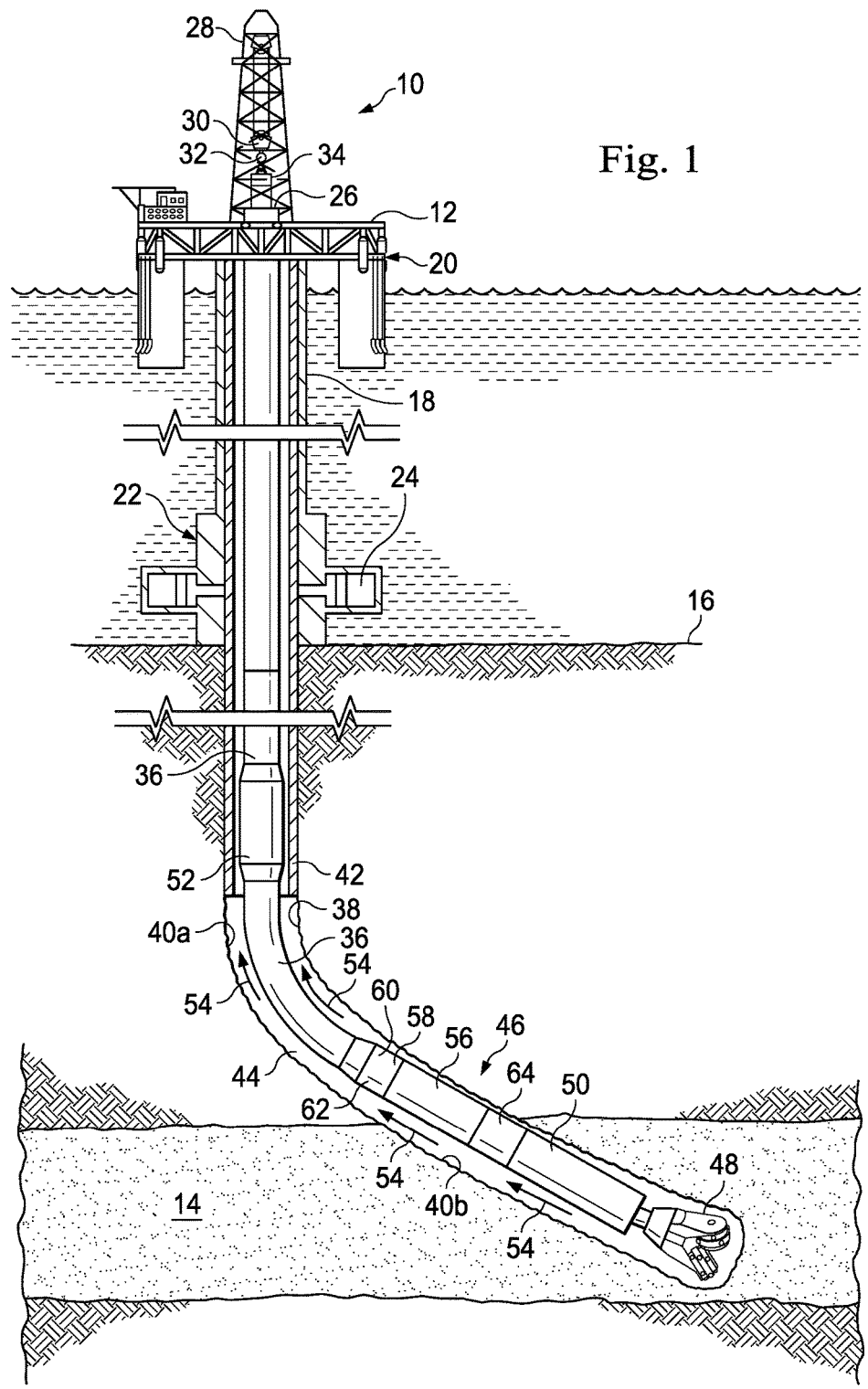
FIG. 1 is a schematic illustration of an offshore oil and gas platform operably coupled to a well tool disposed within a wellbore, the well tool including a load-bearing assembly, according to an exemplary embodiment.

Illustrative embodiments and related methods of the present disclosure are described below as they might be employed in a method and/or apparatus for determining the optimal radius of a thrust bearing in a well tool. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure. Further aspects and advantages of the various embodiments and related methods of the disclosure will become apparent from consideration of the following description and drawings.

The following disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper," "uphole," "downhole," "upstream," "downstream," and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. For example, if the apparatus in the figures is turned over, elements described as being "below" or "beneath" other elements or features would then be oriented "above" the other elements or features. Thus, the exemplary term "below" may encompass both an orientation of above and below. The apparatus may be otherwise oriented (rotated 90 degrees or at other orientations) and the spatially relative descriptors used herein may likewise be interpreted accordingly.

In an exemplary embodiment, as illustrated in FIG. 1, an offshore oil or gas platform is schematically illustrated and generally designated by the reference numeral 10. A semi-submersible platform 12 is positioned over a submerged oil and gas formation 14 located below a sea floor 16. A subsea conduit 18 extends from a deck 20 of the platform 12 to a subsea wellhead installation 22, which includes blowout preventers 24. The platform 12 has a hoisting apparatus 26, a derrick 28, a travel block 30, a hook 32, and a swivel 34 for raising and lowering pipe strings, such as a substantially tubular, axially extending drill string 36. A wellbore 38 extends through the various earth strata, including the formation 14, and may include an upper section 40a and a lower section 40b. The wellbore 38 includes a casing string 42 cemented in a portion thereof. An annulus 44 is defined between the wellbore 38 and the drill string 36. A well tool 46 is connected at the lower end portion of the drill string 36 and extends within the wellbore 38. The well tool 46 includes a rotary drill bit 48, which is supported by a rotary steerable drilling tool 50. The rotary steerable drilling tool 50 is adapted to drill directionally through the various earth strata, including the formation 14. One or more drill collars 52 are connected at intervals within the drill string 36. The drill collars 52 are adapted to apply weight on the rotary drill bit 48 through the drill string 36 during drilling operations (referred to as "weight-on-bit").

In an exemplary embodiment, the wellbore 38 is drilled by rotating the drill string 36 via a rotary table or top-drive (not shown) while applying weight-on-bit to the well tool 46, thereby rotating the rotary drill bit 48 against the bottom of the wellbore 38. The rotary steerable drilling tool 50 is capable of controlling the angle and azimuth of the rotary drill bit 48 relative to the wellbore 38 during drilling operations. Controlling the angle and azimuth of the rotary drill bit 48 during drilling operations enables directional-drilling of the wellbore 38, such that the upper section 40a may be drilled in a substantially vertical direction and the lower section 40b may be drilled in a deviated, curved, or horizontal direction, as shown in FIG. 1. As the rotary drill bit 48 drills through the various earth strata, including the formation 14, a drilling fluid 54 is circulated from the surface, through the drill string 36 and the well tool 46, and into the wellbore 38. The drilling fluid 54 flows into the wellbore 38 through jets (not shown) in the rotary drill bit 48, thereby clearing away drill cuttings (not shown) from the rotary drill bit 48 and carrying the drill cuttings to the surface through the annulus 44.

The well tool 46 further includes a power section 56 such as, for example, a mud motor or turbine, connected above the rotary steerable drilling tool 50. The power section 56 includes a rotor (not shown) that is operably coupled to the rotary drill bit 48. As the drilling fluid 54 is circulated through the drill string 36, the well tool 46, and the annulus 44 during drilling operations, the drilling fluid 54 imparts rotation to the rotor of the power section 56, which rotor, in turn, drives the rotary drill bit 48. In this manner, the power section 56 is utilized to increase the rotational speed of the rotary drill bit 48 above the rotational speed applied to the drill string 36 by the rotary table or top-drive (not shown). Although FIG. 1 depicts the power section 56 located above the rotary steerable drilling tool 50 in the well tool 46, the power section 56 may alternately be located elsewhere in the well tool 46 such as, for example, between the rotary drill bit 48 and the rotary steerable drilling tool 50. Alternatively, the power section 56 may be omitted from the well tool 46.

The well tool 46 further includes one or more logging tools 58. The one or more logging tools 58 may include, for example, measurement-while-drilling ("MWD") tools 60 and/or logging-while-drilling ("LWD") tools 62. The MWD tools 60 are adapted to measure the physical properties of the wellbore 38 during drilling operations, such as, for example, pressure, temperature, and wellbore trajectory in three-dimensional space. The LWD tools 62 are adapted to measure the physical properties of the formation 14 during drilling operations, such as, for example, gamma ray, sonic velocity, resistivity, and porosity. Although FIG. 1 depicts the one or more logging tools 58 located above the rotary steerable drilling tool 50 and the power section 56 in the well tool 46, the one or more logging tools 58 may alternately be located elsewhere in the well tool 46 such as, for example, between the rotary steerable drilling tool 50 and the power section 56. Alternatively, the one or more logging tools 58 may be omitted from the well tool 46. The well tool 46 may also include other components such as, for example, drill collars, heavy-weight drill pipe, stabilizers, reamers, jarring devices, hole-openers, crossovers for various threadforms, or any combination thereof.

In order to change the path of the wellbore 38, the rotary steerable drilling tool 50 changes the angle and azimuth of the rotary drill bit 48 relative to the wellbore 38 during drilling operations. The rotary steerable drilling tool 50 is thus capable of altering the trajectory of the wellbore 38. By so altering the trajectory of the wellbore 38, the rotary steerable drilling tool 50 causes the rotary drill bit 48 to drill through the various earth strata and/or the formation 14 along a curved or deviated path, as shown in FIG. 1. As the depth of the wellbore 38 is further advanced by the rotary drill bit 48, the well tool 46 traverses the deviated or curved portion of the wellbore 38. The well tool 46 is subject to external forces as it traverses the deviated or curved portion of the wellbore 38, which cause a bending moment and corresponding deflection of the well tool 46.

In several exemplary embodiments, other forces contribute to the bending moment and/or deflection of the well tool 46 such as, for example, the rotation of the well tool 46, the weight-on-bit applied to the well tool 46, the pressure and temperature within the well tool 46 and the wellbore 38, a side load acting on the well tool 46, and/or other factors. The well tool 46 includes a load-bearing assembly 64 adapted to carry axial and radial loads applied to the well tool 46, even as the well tool 46 is subject to a bending moment and/or a deflection. In several exemplary embodiments, the well tool 46 includes more than one load-bearing assembly 64.

Although FIG. 1 depicts a horizontal wellbore, it should be understood by those skilled in the art that the illustrative embodiments of the present disclosure are equally well suited for use in wellbores having other orientations including vertical wellbores, slanted wellbores, multilateral wellbores or the like. Accordingly, it should be understood by those skilled in the art that the use of directional terms such as "above," "below," "upper," "lower," "upward," "downward," "uphole," "downhole" and the like are used in relation to the illustrative embodiments as they are depicted in the figures, the upward direction being toward the top of the corresponding figure and the downward direction being toward the bottom of the corresponding figure, the uphole direction being toward the surface of the well, the downhole direction being toward the toe of the well. Also, even though FIG. 1 depicts an offshore operation, it should be understood by those skilled in the art that the illustrative embodiments of the present disclosure are equally well suited for use in onshore operations. Further, even though FIG. 1 depicts a cased hole completion, it should be understood that the illustrative embodiments of the present disclosure are equally well suited for use in open hole completions.

Figure 2:
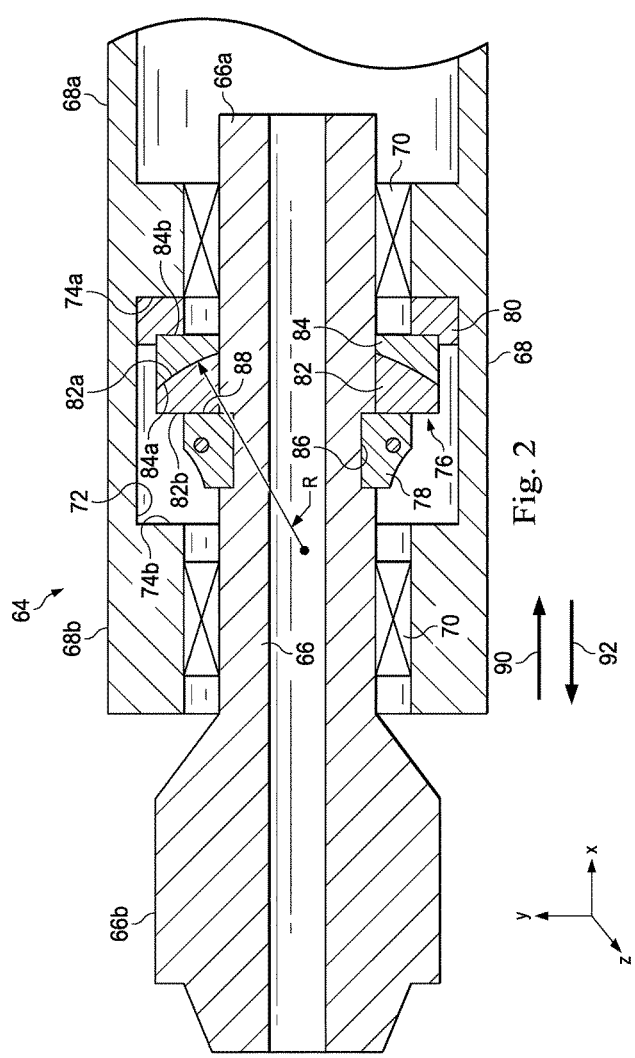
FIG. 2 is a sectional diagrammatic view of the load-bearing assembly of FIG. 1, the load-bearing assembly including a thrust bearing, according to an exemplary embodiment.

In an exemplary embodiment, as illustrated in FIG. 2 with continuing reference to FIG. 1, the load-bearing assembly 64 supports a driveshaft 66 within a housing 68 and is adapted to carry axial and radial loads applied to the driveshaft 66 during drilling operations. The housing 68 is generally tubular and includes opposing end portions 68a, 68b. The driveshaft 66 extends within the housing 68 and includes opposing end portion 66a, 66b. The driveshaft 66 is adapted to rotate relative to the housing 68 during drilling operations. In an exemplary embodiment, the load-bearing assembly 64 includes a pair of axially-spaced radial bearings 70 adapted to carry radial loads applied to the driveshaft 66 as the driveshaft 66 rotates relative to the housing 68. The axially-spaced radial bearings 70 extend circumferentially about the driveshaft 66 and are disposed radially between the driveshaft and the housing 68, thereby supporting the driveshaft 66 within the housing 68. An internal annular recess 72 is formed in the housing 68 between the axially-spaced radial bearings 70. The internal annular recess 72 defines a pair of axially-spaced internal shoulders 74a, 74b.

In an exemplary embodiment, the load-bearing assembly 64 further includes a thrust bearing 76 adapted to carry axial loads applied to the driveshaft 66 as the driveshaft 66 rotates relative to the housing 68. The thrust bearing 76 extends circumferentially about the driveshaft 66 and is disposed radially between the driveshaft 66 and the housing 68, extending within the internal annular recess 72. In an exemplary embodiment, the thrust bearing 76 is a spherical thrust bearing. In an exemplary embodiment, the thrust bearing 76 is a self-aligning bearing. The thrust bearing 76 includes a bearing ring 78, a load ring 80, and a pair of thrust rings 82, 84. The bearing ring 78 extends circumferentially about the driveshaft 66 and fits complementarily within an external annular recess 86 formed in the driveshaft 66. The bearing ring 78 defines a radially-extending contact surface 88, which protrudes from the external annular recess 86. The load ring 80 is at least partially disposed within the internal annular recess 72 of the housing 66, extending circumferentially thereabout. The load ring 80 is located adjacent the internal shoulder 74a. The thrust rings 82, 84 are disposed axially between the bearing ring 78 and the load ring 80. The thrust ring 82 defines a convex surface 82a and a radially-extending contact surface 82b, which surfaces extend circumferentially about the driveshaft 66. Similarly, the thrust ring 84 defines a concave surface 84a and a seating surface 84b, which surfaces extend circumferentially about the driveshaft 66. The radially-extending contact surface 88 of the bearing ring 78 engages the radially-extending contact surface 82b of the thrust ring 82. The load ring 80 is compressed between the seating surface 84b of the thrust ring 84 and the internal shoulder 74a. The thrust bearing 76 defines a radius R, which is shared by the convex surface 82a of the thrust ring 82 and the concave surface 84a of the thrust ring 84, as shown in FIG. 2. Accordingly, the convex and concave surfaces 82a, 84a, respectively, are adapted to mate with one another, thereby carrying an axial load applied to the driveshaft 66 in a direction 90 and/or an axial load applied to the housing 68 in a direction 92, which is opposite the direction 90. Although FIG. 2 depicts the radius R extending from a point between the thrust bearing 76 and the end portion 66b of the driveshaft 66, the radius R could alternatively extend from a point between the thrust bearing 76 and the end portion 66a of the driveshaft 66.

In operation, as discussed above, the driveshaft 66 rotates relative to the housing 68. In an exemplary embodiment, the bearing ring 78 rotates along with the driveshaft 66 and relative to the thrust ring 82. Further, the housing 68, the load ring 80, and the thrust rings 82, 84, do not rotate relative to one another. As a result, the radially-extending contact surface 88 of the bearing ring 78 and the radially-extending contact surface 82b of the thrust ring 82 are in rotating contact with one another, thereby forming opposing bearing surfaces. In another exemplary embodiment, the bearing ring 78 and the thrust ring 82 rotate along with the driveshaft 66 and relative to the thrust ring 84. Further, the housing 68, the load ring 80, and the thrust ring 84 do not rotate relative to one another. As a result, the convex surface 82a of the thrust ring 82 and the concave surface 84a of the thrust ring 84 are in rotating contact with one another, thereby forming opposing bearing surfaces. As discussed above, the well tool 46 is subject to external forces as it traverses the deviated or curved portion of the wellbore 38. The driveshaft 66 and the housing 68 are also subject to external forces as the well tool 46 traverses the deviated or curved portion of the wellbore 38, which cause a bending moment and corresponding deflection of the driveshaft 66 and the housing 68. The convex and concave surfaces 82a, 84a, respectively, are adapted to accommodate the bending moment and/or deflection of the driveshaft 66 by shifting transversely relative to one another, thereby reducing the radial reaction force carried by the thrust bearing 76 when the well tool 46 traverses the deviated or curved portion of the wellbore 38.

Figure 3:
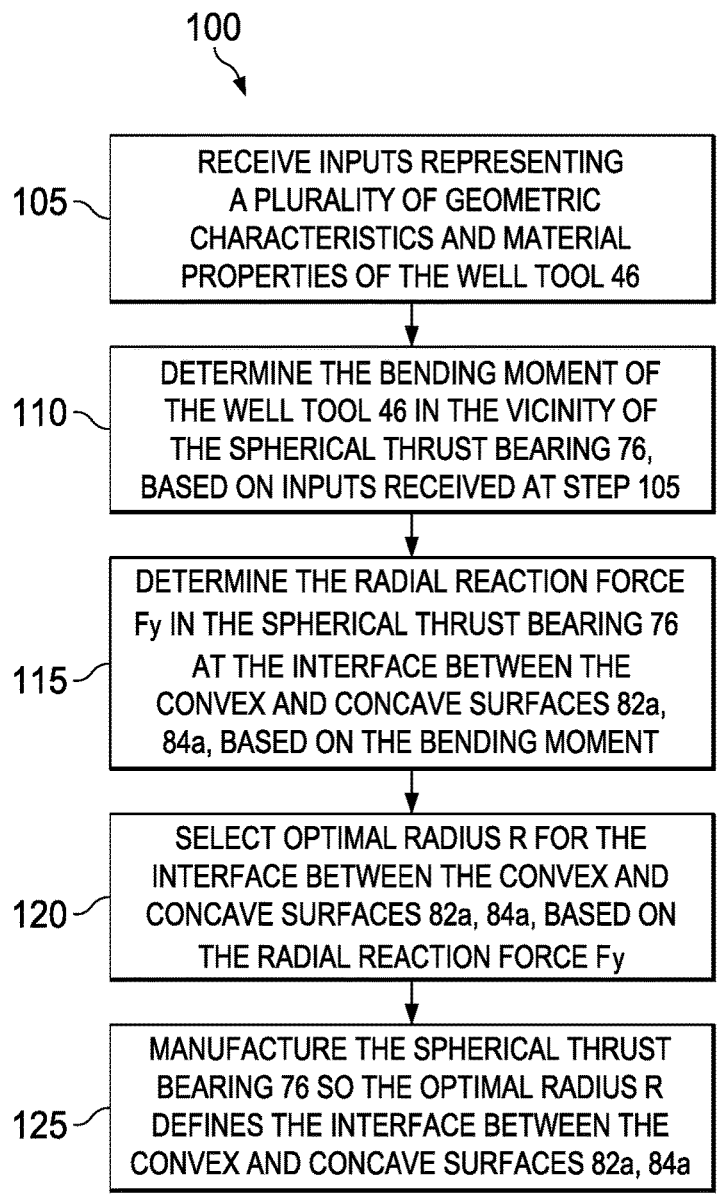
FIG. 3 is a flow-chart diagram illustrating a method for determining the optimal radius of the thrust bearing of FIG. 2, according to an exemplary embodiment.

In an exemplary embodiment, as illustrated in FIG. 3 with continuing reference to FIGS. 1 and 2, a method for minimizing a radial reaction force $F_y$ (shown in FIG. 5) in the thrust bearing 76 of the well tool 46, the well tool 46 being disposed within the wellbore 38 and subject to a bending moment, is generally referred to by the reference numeral 100. The method 100 includes receiving inputs, using one or more computing devices, representing a plurality of geometric characteristics and material properties of the well tool 46 at step 105; determining, based on the inputs, using the one or more computing devices, the bending moment of the well tool 46 in the vicinity of the thrust bearing 76 at step 110; determining, based on the bending moment, using the one or more computing devices, the radial reaction force $F_y$ in the thrust bearing 76 at the interface between the convex and concave surfaces 82a, 84a, respectively, at step 115; selecting, based on the radial reaction force $F_y$, using the one or more computing devices, an optimal radius R for the interface between the convex and concave surfaces 82a, 84a, respectively, at step 120; and manufacturing the thrust bearing 76 so the optimal radius R defines the interface between the convex and concave surfaces 82a, 84a, respectively, at step 125.

At the step 105, as shown in FIG. 3, inputs representing the plurality of geometric characteristics and material properties of the well tool 46 are received by the one or more computing devices. The geometric characteristics of the well tool 46 include the location and configuration of the load-bearing assembly 64, i.e., the location of the thrust bearing 76 and the axially-spaced radial bearings 70. The geometric characteristics of the well tool 46 also include the location and configuration of the driveshaft 66 and the housing 68 in relation to one another and in relation to the load-bearing assembly 64. Although several exemplary embodiments of the load-bearing assembly 64 have been described above, the axially-spaced radial bearings 70 and the thrust bearing 76 may be arranged in any number of configurations in order to carry the axial and radial loads applied to the driveshaft 66 during drilling operations. Further, in addition to the axially-spaced radial bearings 70 and the thrust bearing 76, other components may be utilized to carry the axial and radial loads applied to the driveshaft 66 during drilling operations. The geometric characteristics of the well tool 46 also include the length of the radius R, which radius is shared by the convex and concave surfaces 82a, 84a, respectively. The material properties of the well tool 46 may include, but are not limited to, the modulus of elasticity, Poisson's ratio, shear modulus, density, and coefficient of thermal expansion of the load-bearing assembly 64, the driveshaft 66, and the housing 68. The material properties of the well tool 46 also include the coefficient of friction between the convex and concave surfaces 82a, 84a, respectively, and/or other surface contacts between mating components of the well tool 46. In an exemplary embodiment, the inputs may further include geometric characteristics and material properties of the wellbore 38.

Figure 4:
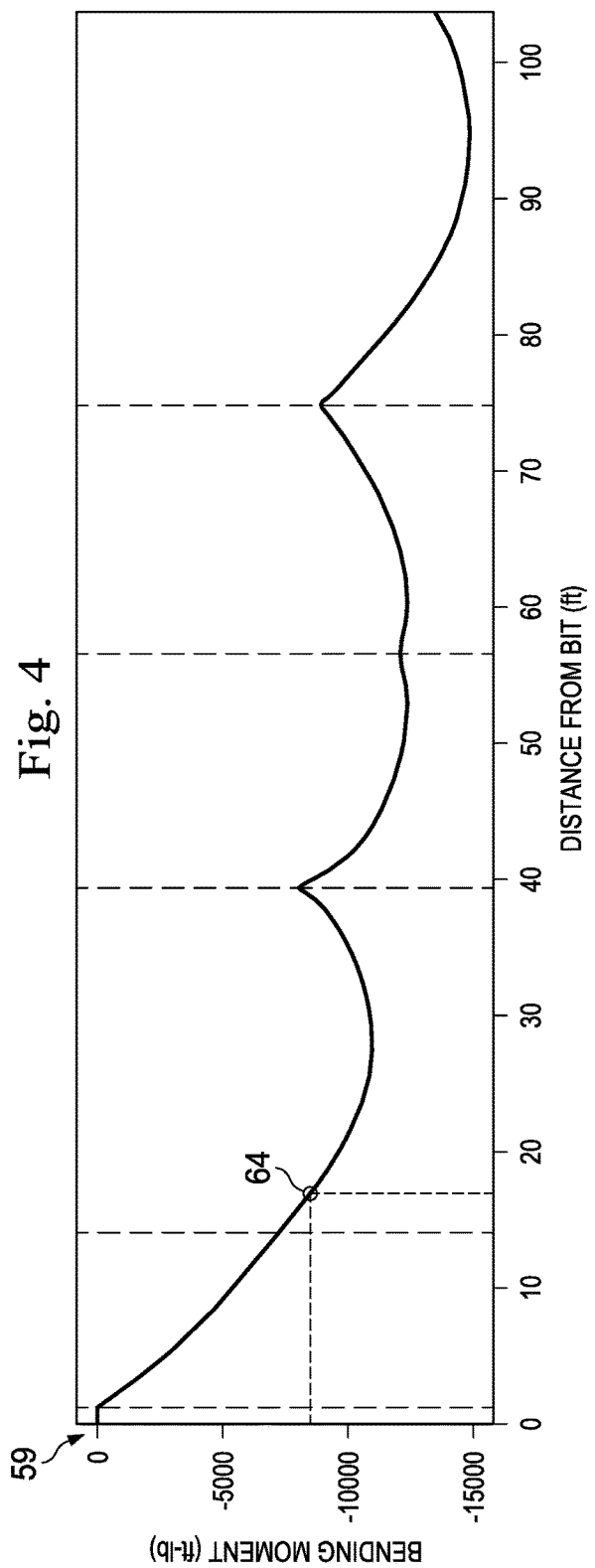
FIG. 4 is a graphical illustration of a step of the method of FIG. 3, according to an exemplary embodiment.

At the step 110, as shown in FIG. 3, the bending moment of the well tool 46 in the vicinity of the thrust bearing 76 is determined based on the inputs, using the one or more computing devices. In an exemplary embodiment, the vicinity of the thrust bearing is located at, or within 10 feet of, the thrust bearing 76. In another exemplary embodiment, the vicinity of the thrust bearing is located at, or within 20 feet of, the thrust bearing 76. The bending moment of the well tool 46 may be determined by the one or more computing devices as a function of distance from the rotary drill bit 48, as shown in FIG. 4. In an exemplary embodiment, an appropriate beam theory is utilized to determine the bending moment along the length of the well tool 46 such as, for example, Timoshenko beam theory. Appropriate geometry, material properties, and loading conditions of the well tool 46 should be applied to solve for bending moment as a function of distance from the rotary drill bit 48, taking into account the expected conditions and geometry of the wellbore 38.

At the step 115, as shown in FIG. 3, the radial reaction force $F_y$ in the thrust bearing 76 at the interface between the convex and concave surfaces 82a, 84a, respectively, is determined, using the one or more computing devices, based on the bending moment of the well tool 46 in the vicinity of the thrust bearing 76. In an exemplary embodiment, the radial reaction force $F_y$ is determined, using the one or more computing devices, by assigning a plurality of radii to the interface between the convex and concave surfaces 82a, 84a, respectively, and determining the radial reaction force $F_y$ at the interface for each of the plurality of radii. In another exemplary embodiment, the radial reaction force $F_y$ is determined, using the one or more computing devices, by constructing a finite element model 94 of the load-bearing assembly 64 supporting the driveshaft 66 within the housing 68, as shown in FIG. 5, and by performing a finite element analysis of the finite element model 94. The construction and finite element analysis of the finite element model 94 will be described in further detail below. In an exemplary embodiment, the components of the finite element model 94 are substantially identical to the load-bearing assembly 64, the driveshaft 66, and the housing 68, which components are given the same reference numerals in FIG. 5 as in FIG. 2. Therefore, the structure of the finite element model 94 will not be described in further detail.

Figure 6A:
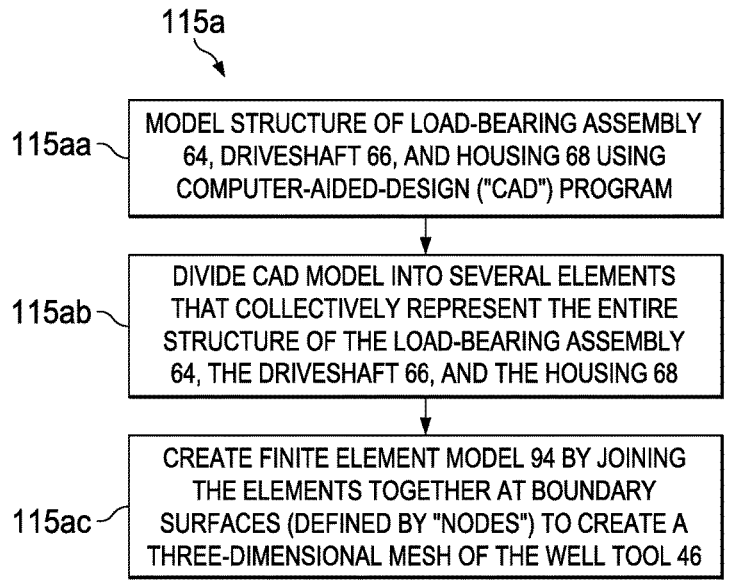
FIGS. 6A and 6B are flow-chart diagrams illustrating respective portions of yet another step of the method of FIG. 3, according to an exemplary embodiment.

In an exemplary embodiment of the step 115, as shown in FIG. 6A with continuing reference to FIG. 3, the step of constructing the finite element model 94 is generally referred to by the reference numeral 115a. The step 115a includes modeling the structure of the load-bearing assembly 64, the driveshaft 66, and the housing 68 using a computer-aided-design ("CAD") program at step 115aa, as shown in FIG. 5. The CAD model is then divided into several elements (not shown) that collectively represent the entire structure of the load-bearing assembly 64, the driveshaft 66, and the housing 68 at step 115ab. Finally, the elements are joined together at boundary surfaces (defined by "nodes") to create a three-dimensional mesh (not shown) at step 115ac, to which material properties, loads, boundary conditions, and constraints can be applied using the one or more computing devices. Once the mesh has been created, the finite element model 94 is capable of simulating the mechanical behavior and properties of load-bearing assembly 64, the driveshaft 66, and the housing 68.

Figure 6B:
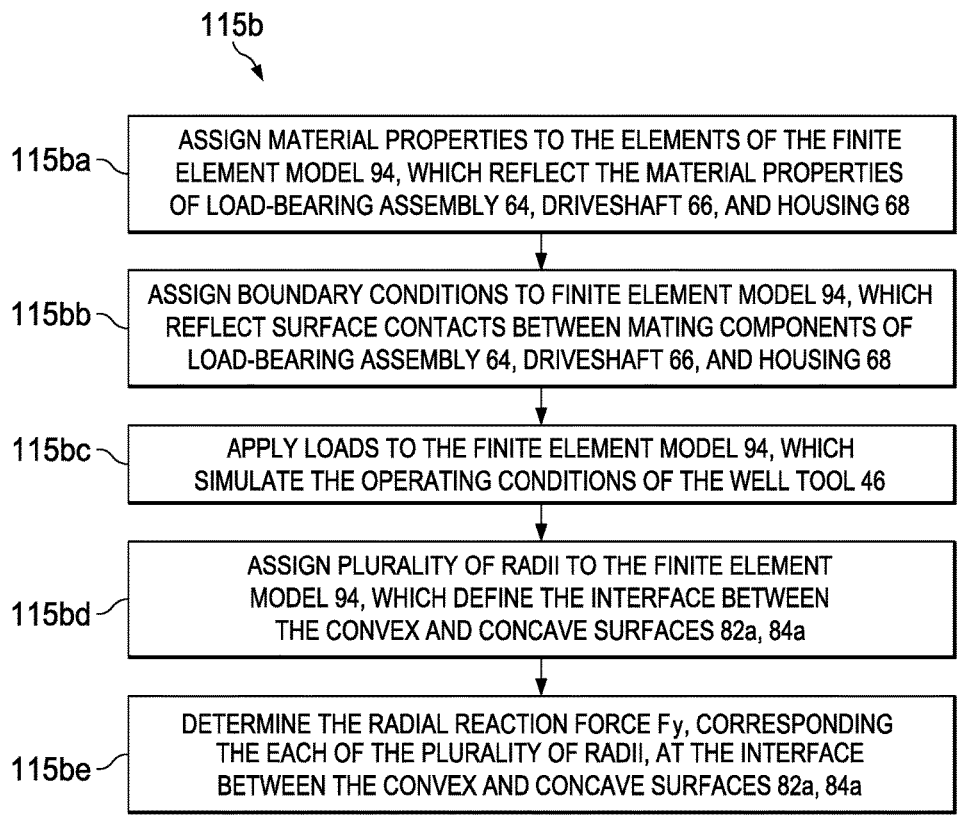
Figure 7:
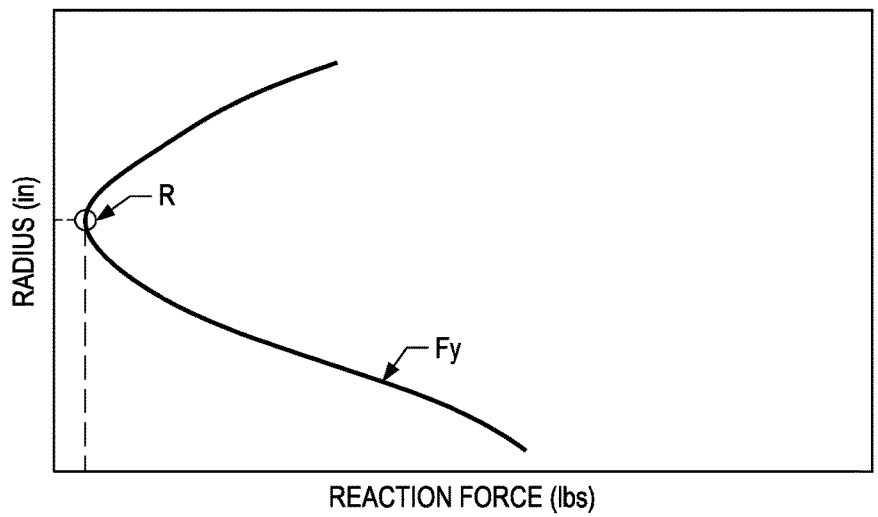
FIG. 7 is a graphical illustration of the portion of the yet another step of FIG. 6B, according to an exemplary embodiment.

In an exemplary embodiment of the step 115, as illustrated in FIG. 6B with continuing reference to FIGS. 3A and 6A, the step of performing a finite element analysis of the finite element model 94 is generally referred to by the reference numeral 115b. The step 115b includes assigning material properties to the elements of the finite element model 94 at step 115ba, which reflect the material properties of the load-bearing assembly 64, the driveshaft 66, and the housing 68; assigning boundary conditions and constraints to the finite element model 94 at step 115bb, which reflect surface contacts between mating components of the load-bearing assembly 64, the driveshaft 66, and the housing 68; applying loads to the finite element model 94 at step 115bc, as shown in FIG. 5, which simulate the operating conditions of the well tool 46; assigning a plurality of radii to the finite element model 94 at step 115bd, which define the interface between the convex and concave surfaces 82a, 84a, respectively; and determining the radial reaction force $F_y$ corresponding to each of the plurality of radii at step 115be, at the interface between the convex and concave surfaces 82a, 84a, respectively, as shown in FIG. 7.

At the step 115ba, as shown in FIG. 6B, the material properties of the various elements of the finite element model 94 are determined and received as inputs by the one or more computing devices. The material properties may include, but are not limited to, the modulus of elasticity, Poisson's ratio, shear modulus, density, and coefficient of thermal expansion of the load-bearing assembly 64, the driveshaft 66, and the housing 68. In order to simulate the material properties of the load-bearing assembly 64, the driveshaft 66, and the housing 68, values representing the material properties of these components are assigned to the corresponding elements of the mesh. At this point, the mesh reflects the geometry and the material properties of the load-bearing assembly 64, the driveshaft 66, and the housing 68. As a result, the stiffness of the load-bearing assembly 64, the driveshaft 66, and the housing 68, which is a function of geometry and material properties, can be determined by the one or more computing devices.

At the step 115bb, as shown in FIG. 6B, the boundary conditions and constraints of the finite element model 94 are determined and received as inputs by the one or more computing devices. In order to predict how the finite element model 94 will deform under load, the finite element model 94 must be sufficiently constrained in the finite element analysis to prevent all possible modes of rigid body motion. The finite element model 94 has six rigid body modes of motion, which include translation in each of three mutually orthogonal directions, as depicted by the reference numerals x, y, and z, and rotation about the axes defining each of the three mutually orthogonal directions x, y, z. In order to simulate contact between the housing 68 and the wellbore 38, an axially-facing end surface 68aa of the end portion 68a of the finite element model 94 is constrained to prevent all six rigid body modes of motion, as shown in FIG. 5. Boundary conditions representing contacts between mating surfaces of the finite element model 94 should also be defined, including the coefficient of friction between the convex surface 82a and the concave surface 84a. Once all appropriate constraints and boundary conditions of the finite element model 94 are defined, loads can be applied to the finite element model 94 using the one or more computing devices.

At the step 115bc, as shown in FIG. 6B, the loads that are applied to the finite element model 94 are determined and received as inputs by the one or more computing devices, including the bending moment of the well tool 46 in the vicinity of the thrust bearing 76, as determined at the step 110. The bending moment of the well tool 46 at the location of, or in the vicinity of, the thrust bearing 76 is denoted by the reference numeral M in FIGS. 4 and 5. In order to perform the finite element analysis, the bending moment M is applied to the end portion 66b of the driveshaft 66. Additionally, the weight-on-bit experienced by the well tool 46 at the location of the load-bearing assembly 46 is denoted by the reference numeral W in FIG. 5. In order to perform the finite element analysis, the weight-on-bit W is applied to an axially-facing end surface 66ba of the end portion 66b of the finite element model 94.

At the step 115bd, as shown in FIG. 6B, a plurality of radii defining the interface between the convex and concave surfaces 82a, 84a, respectively, are assigned to the finite element model 94 using the one or more computing devices. The respective lengths of the plurality of radii, which span the range of possible lengths of the radius R shared by the convex and concave surfaces 82a, 84a, respectively, are determined by reference to the geometry of the load-bearing assembly 64, the driveshaft 66, and the housing 68. Each possible length of the radius R may be individually received as an input by the one or more computing devices. Alternatively, the range of possible lengths of the radius R may be stored in a database and automatically received as inputs by the one or more computing devices.

At the step 115be, as shown in FIG. 6B, the radial reaction force $F_y$ at the interface between the convex and concave surfaces 82a, 84a, respectively, corresponding to each of the plurality of radii, is determined using the one or more computing devices. After the plurality of radii, representing the range of possible lengths for the radius R, are received as inputs by the one or more computing devices, the reaction force $F_y$ at the boundary between the convex and concave surfaces 82a, 84a, respectively, is determined as a function of the radius R, as shown in FIG. 7.

At the step 120, as shown in FIG. 3, an optimal radius R, based on the radial reaction force $F_y$, is selected for the interface between the convex and concave surfaces 82a, 84a, respectively, using the one or more computing devices. The optimal radius R is selected from the plurality of radii assigned to the interface between the convex and concave surfaces 82a, 84a, respectively, at the step 115. The optimal radius R is achieved when the boundary between the convex and concave surfaces 82a, 84a, respectively, is subject to the minimum reaction force $F_y$. The optimal radius R can thus be determined by choosing the radius R corresponding to the lowest reaction force $F_y$, as shown in FIG. 7. Finally, at the step 125, the thrust bearing 76 is manufactured so that the optimal radius R, determined at the step 120, defines the interface between the convex and concave surfaces 82a, 84a, respectively. That is, the interface has the optimal radius R.

In several exemplary embodiments, a plurality of instructions, or computer program(s), are stored on a non-transitory computer readable medium, the instructions or computer program(s) being accessible to, and executable by, one or more processors. In several exemplary embodiments, the one or more processors execute the plurality of instructions (or computer program(s)) to repeatedly execute at least the method 100. In several exemplary embodiments, the one or more processors are part of the one or more computing devices employed to build the finite element model 94, one or more other computing devices, or any combination thereof. In several exemplary embodiments, the non-transitory computer readable medium is part of the one or more computing devices employed to build the finite element model 94, one or more other computing devices, or any combination thereof.

Figure 8:
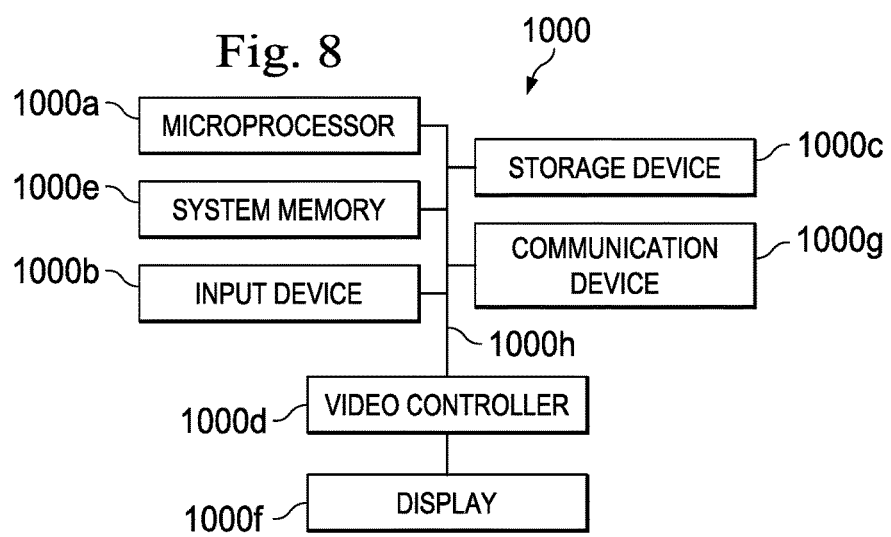
FIG. 8 is a diagrammatic illustration of a computing device for implementing one or more exemplary embodiments of the present disclosure, according to an exemplary embodiment.

In an exemplary embodiment, as illustrated in FIG. 8 with continuing reference to FIGS. 1-5, 6A, 6B, and 7, an illustrative computing device 1000 for implementing one or more embodiments of one or more of the above-described elements, methods and/or steps, and/or any combination thereof, is depicted. The computing device 1000 includes a microprocessor 1000a, an input device 1000b, a storage device 1000c, a video controller 1000d, a system memory 1000e, a display 1000f, and a communication device 1000g all interconnected by one or more buses 1000h. In several exemplary embodiments, the storage device 1000c may include a floppy drive, hard drive, CD-ROM, optical drive, any other form of storage device and/or any combination thereof. In several exemplary embodiments, the storage device 1000c may include, and/or be capable of receiving, a floppy disk, CD-ROM, DVD-ROM, or any other form of computer-readable medium that may contain executable instructions. In several exemplary embodiments, the communication device 1000g may include a modem, network card, or any other device to enable the computing device 1000 to communicate with other computing devices. In several exemplary embodiments, any computing device represents a plurality of interconnected (whether by intranet or Internet) computer systems, including without limitation, personal computers, mainframes, PDAs, smartphones and cell phones.

In several exemplary embodiments, one or more of the components of the one or more computing devices employed to build the finite element model 94 include at least the computing device 1000 and/or components thereof, and/or one or more computing devices that are substantially similar to the computing device 1000 and/or components thereof. In several exemplary embodiments, one or more of the above-described components of the computing device 1000 and/or the one or more computing devices employed to build the finite element model 94 include respective pluralities of same components.

In several exemplary embodiments, a computer system typically includes at least hardware capable of executing machine readable instructions, as well as the software for executing acts (typically machine-readable instructions) that produce a desired result. In several exemplary embodiments, a computer system may include hybrids of hardware and software, as well as computer sub-systems.

In several exemplary embodiments, hardware generally includes at least processor-capable platforms, such as client-machines (also known as personal computers or servers), and hand-held processing devices (such as smart phones, tablet computers, personal digital assistants (PDAs), or personal computing devices (PCDs), for example). In several exemplary embodiments, hardware may include any physical device that is capable of storing machine-readable instructions, such as memory or other data storage devices. In several exemplary embodiments, other forms of hardware include hardware sub-systems, including transfer devices such as modems, modem cards, ports, and port cards, for example.

In several exemplary embodiments, software includes any machine code stored in any memory medium, such as RAM or ROM, and machine code stored on other devices (such as floppy disks, flash memory, or a CD ROM, for example). In several exemplary embodiments, software may include source or object code. In several exemplary embodiments, software encompasses any set of instructions capable of being executed on a computing device such as, for example, on a client machine or server.

In several exemplary embodiments, combinations of software and hardware could also be used for providing enhanced functionality and performance for certain embodiments of the present disclosure. In an exemplary embodiment, software functions may be directly manufactured into a silicon chip. Accordingly, it should be understood that combinations of hardware and software are also included within the definition of a computer system and are thus envisioned by the present disclosure as possible equivalent structures and equivalent methods.

In several exemplary embodiments, computer readable mediums include, for example, passive data storage, such as a random access memory (RAM) as well as semi-permanent data storage such as a compact disk read only memory (CD-ROM). One or more exemplary embodiments of the present disclosure may be embodied in the RAM of a computer to transform a standard computer into a new specific computing machine. In several exemplary embodiments, data structures are defined organizations of data that may enable an embodiment of the present disclosure. In an exemplary embodiment, a data structure may provide an organization of data, or an organization of executable code.

In several exemplary embodiments, any networks and/or one or more portions thereof, may be designed to work on any specific architecture. In an exemplary embodiment, one or more portions of any networks may be executed on a single computer, local area networks, client-server networks, wide area networks, internets, hand-held and other portable and wireless devices and networks.

In several exemplary embodiments, a database may be any standard or proprietary database software. In several exemplary embodiments, the database may have fields, records, data, and other database elements that may be associated through database specific software. In several exemplary embodiments, data may be mapped. In several exemplary embodiments, mapping is the process of associating one data entry with another data entry. In an exemplary embodiment, the data contained in the location of a character file can be mapped to a field in a second table. In several exemplary embodiments, the physical location of the database is not limiting, and the database may be distributed. In an exemplary embodiment, the database may exist remotely from the server, and run on a separate platform. In an exemplary embodiment, the database may be accessible across the Internet. In several exemplary embodiments, more than one database may be implemented.

In several exemplary embodiments, a plurality of instructions stored on a computer readable medium may be executed by one or more processors to cause the one or more processors to carry out or implement in whole or in part the above-described operation of each of the above-described exemplary embodiments of the method 100. In several exemplary embodiments, such a processor may include one or more of the microprocessor 1000a and any processor(s) that are part of the components of the one or more computing devices employed to build the finite element model 94. Such a computer readable medium may be distributed among one or more components of the one or more computing devices employed to build the finite element model 94. In several exemplary embodiments, such a processor may execute the plurality of instructions in connection with a virtual computer system. In several exemplary embodiments, such a plurality of instructions may communicate directly with the one or more processors, and/or may interact with one or more operating systems, middleware, firmware, other applications, and/or any combination thereof, to cause the one or more processors to execute the instructions.

The present disclosure introduces a method of producing a thrust bearing for a well tool, the method including receiving, using one or more computing devices, inputs representing a plurality of geometric characteristics and material properties of the well tool, the well tool including a first tubular member, a second tubular member extending within the first tubular member, and the thrust bearing, which includes an interface defined between mating convex and concave surfaces, the interface extending circumferentially about the second tubular member; determining, based on the inputs and using the one or more computing devices, an expected value of a bending moment of the well tool in the vicinity of the thrust bearing; determining, based on the expected value of the bending moment and using the one or more computing devices, an expected value of a radial reaction force for each of a plurality of prospective radii of the interface, the radial reaction force being located at the interface between the convex and concave surfaces; and manufacturing the thrust bearing so that the interface between the convex and concave surfaces has an optimal radius selected from the plurality of prospective radii; wherein the optimal radius reduces the radial reaction force in the thrust bearing when the well tool is subjected to the bending moment. In an exemplary embodiment, determining, based on the inputs and using the one or more computing devices, the expected value of the bending moment of the well tool in the vicinity of the thrust bearing includes utilizing beam theory to determine the expected value of the bending moment of the well tool at a position along the length of the well tool in the vicinity of the thrust bearing. In an exemplary embodiment, the optimal radius corresponds to the lowest determined expected value of the radial reaction force at the interface between the convex and concave surfaces.

The present disclosure also introduces a method for minimizing a radial reaction force in a thrust bearing of a well tool when the well tool is disposed within a wellbore and subjected to a bending moment, the method including receiving, using one or more computing devices, inputs representing a plurality of geometric characteristics and material properties of the well tool, the well tool including a tubular housing, a shaft extending within the tubular housing, and the thrust bearing, which includes convex and concave surfaces that mate to define an interface therebetween, the interface having a radius and extending circumferentially about the shaft; determining, based on the inputs and using the one or more computing devices, an expected value of the bending moment of the well tool in the vicinity of the thrust bearing; determining, based on the expected value of the bending moment and using the one or more computing devices, one or more expected values of the radial reaction force in the thrust bearing at the interface between the convex and concave surfaces, the one or more expected values of the radial reaction force being dependent upon the radius of the interface; and selecting, based on the one or more expected values of the radial reaction force and using the one or more computing devices, an optimal radius of the interface between the convex and concave surfaces; wherein the optimal radius minimizes the radial reaction force in the thrust bearing when the well tool is disposed within the wellbore and subjected to the bending moment. In an exemplary embodiment, determining, based on the inputs and using the one or more computing devices, the expected value of the bending moment of the well tool in the vicinity of the thrust bearing includes utilizing beam theory to determine the expected value of the bending moment of the well tool at a position along the length of the well tool in the vicinity of the thrust bearing. In an exemplary embodiment, determining, based on the expected value of the bending moment and using the one or more computing devices, the one or more expected values of the radial reaction force in the thrust bearing at the interface between the convex and concave surfaces includes assigning a plurality of radii to the interface between the convex and concave surfaces; and determining the expected value of the radial reaction force, at the interface between the convex and concave surfaces, for each of the plurality of radii; wherein the optimal radius of the interface between the convex and concave surfaces is selected, using the one or more computing devices, from the plurality of radii. In an exemplary embodiment, the optimal radius corresponds to the lowest determined expected value of the radial reaction force at the interface between the convex and concave surfaces. In an exemplary embodiment, the method further includes manufacturing the thrust bearing so that the interface between the convex and concave surfaces has the optimal radius selected from the plurality of radii. In an exemplary embodiment, determining, based on the expected value of the bending moment and using the one or more computing devices, the one or more expected values of the radial reaction force in the thrust bearing at the interface between the convex and concave surfaces includes constructing a finite element model of the well tool; and performing a finite element analysis of the finite element model. In an exemplary embodiment, constructing the finite element model of the well tool includes constructing a model of the structure of the well tool; dividing the model into a plurality of elements that collectively represent the entire structure of the well tool; and generating a three-dimensional mesh of the model by connecting the plurality of elements to one another at common nodes, to which material properties, boundary conditions, and constraints may be applied. In an exemplary embodiment, performing the finite element analysis of the finite element model includes assigning material properties to the elements of the finite element model to reflect the material properties of the well tool; assigning boundary conditions and constraints to the finite element model to reflect surface contacts between mating components of the well tool and the wellbore; and applying loads to the finite element model to simulate the operating conditions of the well tool. In an exemplary embodiment, performing the finite element analysis of the finite element model further includes assigning a plurality of radii to the finite element model to define the interface between the convex and concave surfaces; and determining the expected value of the radial reaction force at the interface between the convex and concave surfaces for each of the plurality of radii; wherein the optimal radius for the interface between the convex and concave surfaces is selected from the plurality of radii. In an exemplary embodiment, the optimal radius corresponds to the lowest determined expected value of the radial reaction force at the interface between the convex and concave surfaces.

The present disclosure also introduces an apparatus for minimizing a radial reaction force in a thrust bearing of a well tool when the well tool is disposed within a wellbore and subjected to a bending moment, the apparatus including a non-transitory computer readable medium; and a plurality of instructions stored on the non-transitory computer readable medium and executable by one or more processors, the plurality of instructions including instructions that cause the one or more processors to receive inputs representing a plurality of geometric characteristics and material properties of the well tool, the well tool including a tubular housing, a shaft extending within the tubular housing, and the thrust bearing, which includes convex and concave surfaces that mate to define an interface therebetween, the interface having a radius and extending circumferentially about the shaft; instructions that cause the one or more processors to determine, based on the inputs, an expected value of the bending moment of the well tool in the vicinity of the thrust bearing; instructions that cause the one or more processors to determine, based on the expected value of the bending moment, one or more expected values of the radial reaction force in the thrust bearing at the interface between the convex and concave surfaces, the one or more expected values of the radial reaction force being dependent upon the radius of the interface; and instructions that cause the one or more processors to select, based on the one or more expected values of the radial reaction force, an optimal radius of the interface between the convex and concave surfaces; wherein the optimal radius minimizes the radial reaction force in the thrust bearing when the well tool is disposed within the wellbore and subjected to the bending moment. In an exemplary embodiment, the instructions that cause the one or more processors to determine, based on the inputs, the expected value of the bending moment of the well tool in the vicinity of the thrust bearing includes utilizing beam theory to determine the expected value of the bending moment of the well tool at a position along the length of the well tool in the vicinity of the thrust bearing. In an exemplary embodiment, the instructions that cause the one or more processors to determine, based on the expected value of the bending moment, the one or more expected values of the radial reaction force in the thrust bearing at the interface between the convex and concave surfaces includes instructions to assign a plurality of radii to the interface between the convex and concave surfaces; and instructions to determine the expected value of the radial reaction force, at the interface between the convex and concave surfaces, for each of the plurality of radii; wherein the optimal radius of the interface between the convex and concave surfaces is selected from the plurality of radii. In an exemplary embodiment, the optimal radius corresponds to the lowest determined expected value of the radial reaction force at the interface between the convex and concave surfaces. In an exemplary embodiment, the plurality of instructions further include instructions that cause the one or more processors to manufacture the thrust bearing so that the interface between the convex and concave surfaces has the optimal radius selected from the plurality of radii. In an exemplary embodiment, the instructions that cause the one or more processors to determine, based on the expected value of the bending moment, the one or more expected values of the radial reaction force in the thrust bearing at the interface between the convex and concave surfaces include instructions to construct a finite element model of the well tool; and instructions to perform a finite element analysis of the finite element model. In an exemplary embodiment, the instructions to construct the finite element model of the well tool include instructions to construct a model of the structure of the well tool; instructions to divide the model into a plurality of elements that collectively represent the entire structure of the well tool; and instructions to generate a three-dimensional mesh of the model by connecting the plurality of elements to one another at common nodes, to which material properties, boundary conditions, and constraints may be applied. In an exemplary embodiment, the instructions to perform the finite element analysis of the finite element model include instructions to assign material properties to the elements of the finite element model to reflect the material properties of the well tool; instructions to assign boundary conditions and constraints to the finite element model to reflect surface contacts between mating components of the well tool and the wellbore; and instructions to apply loads to the finite element model to simulate the operating conditions of the well tool. In an exemplary embodiment, the instructions to perform the finite element analysis of the finite element model further include instructions to assign a plurality of radii to the finite element model to define the interface between the convex and concave surfaces; and instructions to determine the expected value of the radial reaction force at the interface between the convex and concave surfaces for each of the plurality of radii; wherein the optimal radius for the interface between the convex and concave surfaces is selected from the plurality of radii. In an exemplary embodiment, the optimal radius corresponds to the lowest determined expected value of the radial reaction force at the interface between the convex and concave surfaces.

In several exemplary embodiments, the elements and teachings of the various illustrative exemplary embodiments may be combined in whole or in part in some or all of the illustrative exemplary embodiments. In addition, one or more of the elements and teachings of the various illustrative exemplary embodiments may be omitted, at least in part, and/or combined, at least in part, with one or more of the other elements and teachings of the various illustrative embodiments.

Any spatial references such as, for example, "upper," "lower," "above," "below," "between," "bottom," "vertical," "horizontal," "angular," "upwards," "downwards," "side-to-side," "left-to-right," "left," "right," "right-to-left," "top-to-bottom," "bottom-to-top," "top," "bottom," "bottom-up," "top-down," etc., are for the purpose of illustration only and do not limit the specific orientation or location of the structure described above.

Although several exemplary embodiments have been disclosed in detail above, the embodiments disclosed are exemplary only and are not limiting, and those skilled in the art will readily appreciate that many other modifications, changes and/or substitutions are possible in the exemplary embodiments without materially departing from the novel teachings and advantages of the present disclosure. Accordingly, all such modifications, changes and/or substitutions are intended to be included within the scope of this disclosure as defined in the following claims. In the claims, means-plus-function clauses are intended to cover the structures described herein as performing the recited function and not only structural equivalents, but also equivalent structures.

What is claimed is:

1. A method of producing a thrust bearing for a well tool, the method comprising:
   receiving, using one or more computing devices, inputs representing a plurality of geometric characteristics and material properties of the well tool, the well tool comprising:
   a first tubular member;
   a second tubular member extending within the first tubular member; and
   the thrust bearing, which comprises an interface defined between mating convex and concave surfaces, the interface extending circumferentially about the second tubular member;
   determining, based on the inputs and using the one or more computing devices, an expected value of a bending moment of the well tool in the vicinity of the thrust bearing;
   determining, based on the expected value of the bending moment and using the one or more computing devices, an expected value of a radial reaction force for each of a plurality of prospective radii of the interface, the radial reaction force being located at the interface between the convex and concave surfaces; and
   manufacturing the thrust bearing so that the interface between the convex and concave surfaces has an optimal radius selected from the plurality of prospective radii;
   wherein the optimal radius reduces the radial reaction force in the thrust bearing when the well tool is subjected to the bending moment.

2. The method as recited in claim 1, wherein determining, based on the inputs and using the one or more computing devices, the expected value of the bending moment of the well tool in the vicinity of the thrust bearing comprises utilizing beam theory to determine the expected value of the bending moment of the well tool at a position along the length of the well tool in the vicinity of the thrust bearing.

3. The method as recited in claim 1, wherein the optimal radius corresponds to the lowest determined expected value of the radial reaction force at the interface between the convex and concave surfaces.

4. A method for minimizing a radial reaction force in a thrust bearing of a well tool when the well tool is disposed within a wellbore and subjected to a bending moment, the method comprising:
   receiving, using one or more computing devices, inputs representing a plurality of geometric characteristics and material properties of the well tool, the well tool comprising:
   a tubular housing;
   a shaft extending within the tubular housing; and
   the thrust bearing, which comprises convex and concave surfaces that mate to define an interface therebetween, the interface having a radius and extending circumferentially about the shaft;
   determining, based on the inputs and using the one or more computing devices, an expected value of the bending moment of the well tool in the vicinity of the thrust bearing;
   determining, based on the expected value of the bending moment and using the one or more computing devices, one or more expected values of the radial reaction force in the thrust bearing at the interface between the convex and concave surfaces, the one or more expected values of the radial reaction force being dependent upon the radius of the interface; and
   selecting, based on the one or more expected values of the radial reaction force and using the one or more computing devices, an optimal radius of the interface between the convex and concave surfaces;
   wherein the optimal radius minimizes the radial reaction force in the thrust bearing when the well tool is disposed within the wellbore and subjected to the bending moment.

5. The method as recited in claim 4, wherein determining, based on the inputs and using the one or more computing devices, the expected value of the bending moment of the well tool in the vicinity of the thrust bearing comprises utilizing beam theory to determine the expected value of the bending moment of the well tool at a position along the length of the well tool in the vicinity of the thrust bearing.

6. The method as recited in claim 5, wherein determining, based on the expected value of the bending moment and using the one or more computing devices, the one or more expected values of the radial reaction force in the thrust bearing at the interface between the convex and concave surfaces comprises:
   assigning a plurality of radii to the interface between the convex and concave surfaces; and
   determining the expected value of the radial reaction force, at the interface between the convex and concave surfaces, for each of the plurality of radii;
   wherein the optimal radius of the interface between the convex and concave surfaces is selected, using the one or more computing devices, from the plurality of radii; and
   wherein the optimal radius corresponds to the lowest determined expected value of the radial reaction force at the interface between the convex and concave surfaces.

7. The method as recited in claim 6, wherein the method further comprises manufacturing the thrust bearing so that the interface between the convex and concave surfaces has the optimal radius selected from the plurality of radii.

8. The method as recited in claim 5, wherein determining, based on the expected value of the bending moment and using the one or more computing devices, the one or more expected values of the radial reaction force in the thrust bearing at the interface between the convex and concave surfaces comprises:
   constructing a finite element model of the well tool; and
   performing a finite element analysis of the finite element model.

9. The method as recited claim 8, wherein constructing the finite element model of the well tool comprises:
   constructing a model of the structure of the well tool;
   dividing the model into a plurality of elements that collectively represent the entire structure of the well tool; and
   generating a three-dimensional mesh of the model by connecting the plurality of elements to one another at common nodes, to which material properties, boundary conditions, and constraints may be applied.

10. The method as recited claim 8, wherein performing the finite element analysis of the finite element model comprises:
    assigning material properties to the elements of the finite element model to reflect the material properties of the well tool;
    assigning boundary conditions and constraints to the finite element model to reflect surface contacts between mating components of the well tool and the wellbore; and
    applying loads to the finite element model to simulate the operating conditions of the well tool.

11. The method as recited claim 10, wherein performing the finite element analysis of the finite element model further comprises:
    assigning a plurality of radii to the finite element model to define the interface between the convex and concave surfaces; and
    determining the expected value of the radial reaction force at the interface between the convex and concave surfaces for each of the plurality of radii;
    wherein the optimal radius for the interface between the convex and concave surfaces is selected from the plurality of radii.

12. An apparatus for minimizing a radial reaction force in a thrust bearing of a well tool when the well tool is disposed within a wellbore and subjected to a bending moment, the apparatus comprising:
    a non-transitory computer readable medium; and
    a plurality of instructions stored on the non-transitory computer readable medium and executable by one or more processors, the plurality of instructions comprising:
        instructions that cause the one or more processors to receive inputs representing a plurality of geometric characteristics and material properties of the well tool, the well tool comprising:
            a tubular housing;
            a shaft extending within the tubular housing; and
            the thrust bearing, which comprises convex and concave surfaces that mate to define an interface therebetween, the interface having a radius and extending circumferentially about the shaft;
        instructions that cause the one or more processors to determine, based on the inputs, an expected value of the bending moment of the well tool in the vicinity of the thrust bearing;
        instructions that cause the one or more processors to determine, based on the expected value of the bending moment, one or more expected values of the radial reaction force in the thrust bearing at the interface between the convex and concave surfaces, the one or more expected values of the radial reaction force being dependent upon the radius of the interface; and
        instructions that cause the one or more processors to select, based on the one or more expected values of the radial reaction force, an optimal radius of the interface between the convex and concave surfaces;
        wherein the optimal radius minimizes the radial reaction force in the thrust bearing when the well tool is disposed within the wellbore and subjected to the bending moment.

13. The apparatus as recited in claim 12, wherein the instructions that cause the one or more processors to determine, based on the inputs, the expected value of the bending moment of the well tool in the vicinity of the thrust bearing comprise utilizing beam theory to determine the expected value of the bending moment of the well tool at a position along the length of the well tool in the vicinity of the thrust bearing.

14. The apparatus as recited in claim 13, wherein the instructions that cause the one or more processors to determine, based on the expected value of the bending moment, the one or more expected values of the radial reaction force in the thrust bearing at the interface between the convex and concave surfaces comprise:
    instructions to assign a plurality of radii to the interface between the convex and concave surfaces; and
    instructions to determine the expected value of the radial reaction force, at the interface between the convex and concave surfaces, for each of the plurality of radii;
    wherein the optimal radius of the interface between the convex and concave surfaces is selected from the plurality of radii.

15. The apparatus as recited in claim 14, wherein the optimal radius corresponds to the lowest determined expected value of the radial reaction force at the interface between the convex and concave surfaces.

16. The apparatus as recited in claim 14, wherein the plurality of instructions further comprise instructions that cause the one or more processors to manufacture the thrust bearing so that the interface between the convex and concave surfaces has the optimal radius selected from the plurality of radii.

17. The apparatus as recited in claim 13, wherein the instructions that cause the one or more processors to determine, based on the expected value of the bending moment, the one or more expected values of the radial reaction force in the thrust bearing at the interface between the convex and concave surfaces comprise:
  instructions to construct a finite element model of the well tool; and
    instructions to perform a finite element analysis of the finite element model.

18. The apparatus as recited claim 17, wherein the instructions to construct the finite element model of the well tool comprise:
  instructions to construct a model of the structure of the well tool;
  instructions to divide the model into a plurality of elements that collectively represent the entire structure of the well tool; and
  instructions to generate a three-dimensional mesh of the model by connecting the plurality of elements to one another at common nodes, to which material properties, boundary conditions, and constraints may be applied.

19. The apparatus as recited claim 18, wherein the instructions to perform the finite element analysis of the finite element model comprise:
  instructions to assign material properties to the elements of the finite element model to reflect the material properties of the well tool;
  instructions to assign boundary conditions and constraints to the finite element model to reflect surface contacts between mating components of the well tool and the wellbore; and
  instructions to apply loads to the finite element model to simulate the operating conditions of the well tool.

20. The apparatus as recited claim 19, wherein the instructions to perform the finite element analysis of the finite element model further comprise:
  instructions to assign a plurality of radii to the finite element model to define the interface between the convex and concave surfaces; and
  instructions to determine the expected value of the radial reaction force at the interface between the convex and concave surfaces for each of the plurality of radii;
  wherein the optimal radius for the interface between the convex and concave surfaces is selected from the plurality of radii.

* * * * *